(12) United States Patent
Liu et al.

(10) Patent No.: US 7,095,765 B2
(45) Date of Patent: Aug. 22, 2006

(54) LIGHT EMITTER WITH A VOLTAGE DEPENDENT RESISTOR LAYER

(75) Inventors: Wen-Huang Liu, Hsin-Chu (TW);
Po-Chun Liu, Hsin-Chu (TW);
Min-Hsun Hsieh, Hsin-Chu (TW);
Tzu-Feng Tseng, Hsin-Chu (TW);
Chen Ou, Hsin-Chu (TW)

(73) Assignee: Epistar Corporation, Hsinchu (TW)

( * ) Notice: Subject to any disclaimer, the term of this patent is extended or adjusted under 35 U.S.C. 154(b) by 357 days.

(21) Appl. No.: 10/249,804

(22) Filed: May 9, 2003

(65) Prior Publication Data

US 2004/0125838 A1    Jul. 1, 2004

(30) Foreign Application Priority Data

Dec. 26, 2002   (TW) ................... 91138188 A

(51) Int. Cl.
*H01S 3/00*    (2006.01)
*H01L 27/15*   (2006.01)

(52) U.S. Cl. ..................... 372/38.09; 257/84
(58) Field of Classification Search ........... 372/38.09; 257/84
See application file for complete search history.

(56) References Cited

U.S. PATENT DOCUMENTS

| | | | |
|---|---|---|---|
| 3,743,897 A | | 7/1973 | Hamden, Jr. |
| 4,839,097 A | * | 6/1989 | Noi et al. ............. 252/520.21 |
| 5,358,880 A | * | 10/1994 | Lebby et al. ................. 438/26 |
| 5,563,422 A | * | 10/1996 | Nakamura et al. ............ 257/13 |
| 6,081,540 A | | 6/2000 | Nakatsu |
| 6,172,382 B1 | * | 1/2001 | Nagahama et al. ........... 257/94 |
| 6,693,352 B1 | * | 2/2004 | Huang et al. ................ 257/743 |
| 6,838,701 B1 | * | 1/2005 | Sano ........................... 257/79 |
| 2002/0179914 A1 | | 12/2002 | Sheu |
| 2002/0179918 A1 | | 12/2002 | Sung et al. |
| 2004/0051111 A1 | * | 3/2004 | Ota et al. ..................... 257/98 |

FOREIGN PATENT DOCUMENTS

| | | |
|---|---|---|
| EP | 0 921 577 A1 | 6/1999 |
| JP | WO 02/054503  * | 7/2002 |
| KR | 10-0286699 | 4/2001 |

* cited by examiner

*Primary Examiner*—Armando Rodriguez
(74) *Attorney, Agent, or Firm*—Winston Hsu

(57) ABSTRACT

A light emitter includes an emitting stack, a first electrode, a second electrode and a voltage dependent resistor layer. The emitter stack has a first surface area and a second surface area. The first electrode is formed on the first surface area of the emitting stack. The second electrode is formed on the second surface area of the emitting stack. The voltage dependent resistor layer is connected to the first and second electrodes, and is formed during the formation of the light emitter thus improving the yield of the light emitter.

13 Claims, 7 Drawing Sheets

US 7,095,765 B2

LIGHT EMITTER WITH A VOLTAGE DEPENDENT RESISTOR LAYER

BACKGROUND OF INVENTION

1. Field of the Invention

The present invention relates to a light emitter, and more particularly, a light emitter with a voltage dependent resistor layer.

2. Description of the Prior Art

Light emitters are widely used in optical displays, laser diodes, traffic lights, data storage devices, communications devices, ruminating equipments, and medical equipments.

Please refer to FIG. 1. FIG. 1 shows a related art packaged light emitter 100. As shown in FIG. 1, a light emitter 102 is packaged with a set of zener diodes 104 for releasing static electricity so as to avoid damaging the light emitter 102. However, the zener diodes 104 are connected when packaging the light emitter 102. Therefore no element is provided to discharge static electrically before packaging the light emitter 102. And the light emitter 102 may be damaged by static electricity before it is packaged. Further, the introduction of the zener diodes 104 will complicate the packaging process thereby incurring extra cost.

Please refer to FIG. 2. FIG. 2 shows a light emitting diode 150 bonded with a silicon doped diode 152 disclosed in a published U.S. patent application 2002/0179914. The silicon doped diode 152 is connected to the light emitting diode 150 with a covalent bond. The silicon doped diode 152 is used to release static electricity accumulated on the light emitting diode 150 to avoid damaging the light emitting diode 150. However, the covalent bond between the silicon doped diode 152 and the light emitting diode 150 is formed after the light emitting diode 150 is formed. Therefore the light emitting diode 150 may be damaged before the covalent bond is formed. And the covalent bond also incur additional expense to the structure.

SUMMARY OF INVENTION

It is therefore a present invention to provide a light emitter with a voltage dependent resistor layer to solve the aforementioned problem.

According to the first claimed invention, the light emitter comprises a substrate, and an emitting stack formed on the substrate. The emitting stack comprises a first contact layer having a first surface area and a second surface area, a first cladding layer formed on the first surface area, an emitting layer formed on the first cladding layer, a second cladding layer formed on the emitting layer, and a second contact layer formed on the second cladding layer. The light emitter further comprises a first electrode formed on the second surface area of the first contact layer, a second electrode formed on the second contact layer, and a voltage dependent resistor layer formed on the emitting stack and connected to the first electrode and the second electrode.

According to the second claimed invention, the light emitter comprises a transparent substrate, and an emitting stack formed on the transparent substrate. The emitting stack comprises a first contact layer having a first surface area and a second surface area, a first cladding layer formed on the first surface area, an emitting layer formed on the first cladding layer, a second cladding layer formed on the emitting layer, and a second contact layer formed on the second cladding layer. The light emitter further comprises a first electrode formed on the second surface area of the first contact layer, a second electrode formed on the second contact layer, a first solder layer formed on the first electrode, a second solder layer formed on the second electrode, a first metal layer formed on the first solder layer, a second metal layer formed on the second solder layer, and a voltage dependent resistor layer connected to the first metal layer and the second metal layer, and a carrier formed on the first metal layer, second metal layer and voltage dependent resistor layer.

According to the third claimed invention, the light emitter comprises a first electrode, a conductive substrate formed on the first electrode, a Distributed Bragg reflector layer formed on the conductive substrate, a first cladding layer formed on the Distributed Bragg reflector layer, an emitting layer formed on the first cladding layer, a second cladding layer formed on the emitting layer, a second contact layer formed on the second cladding layer, a second electrode formed on the second contact layer, and a voltage dependent resistor layer connected to the first electrode and the second electrode.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
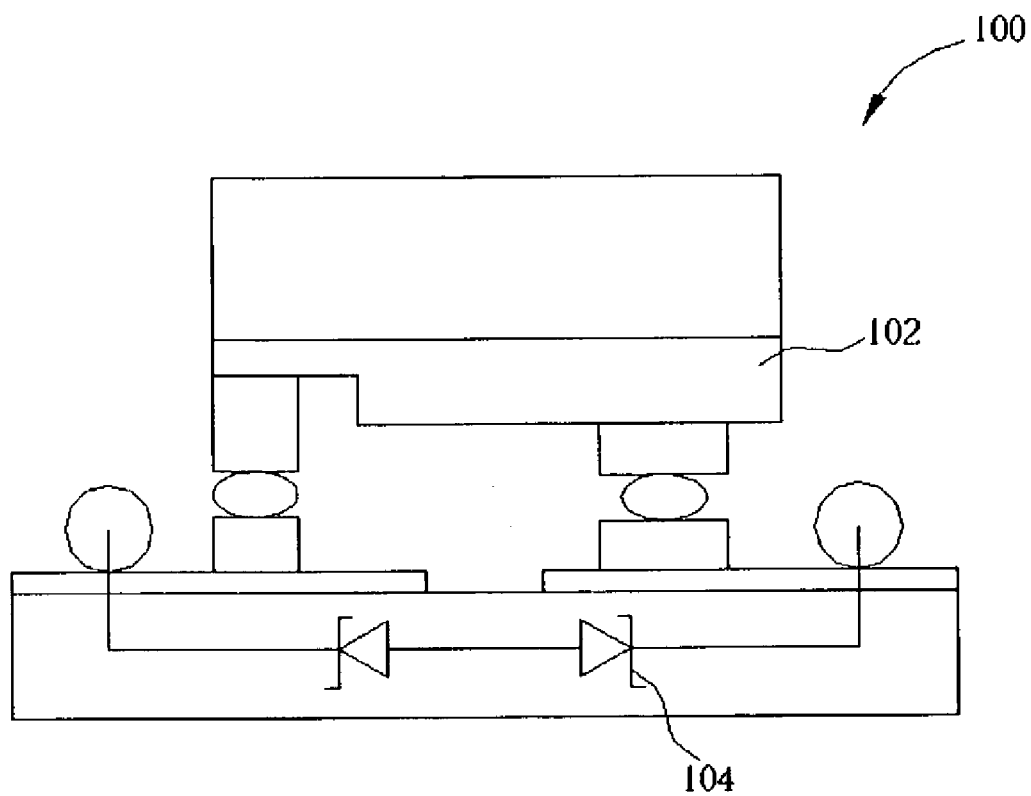
FIG. 1 shows a related art packaged light emitter.
Figure 2:
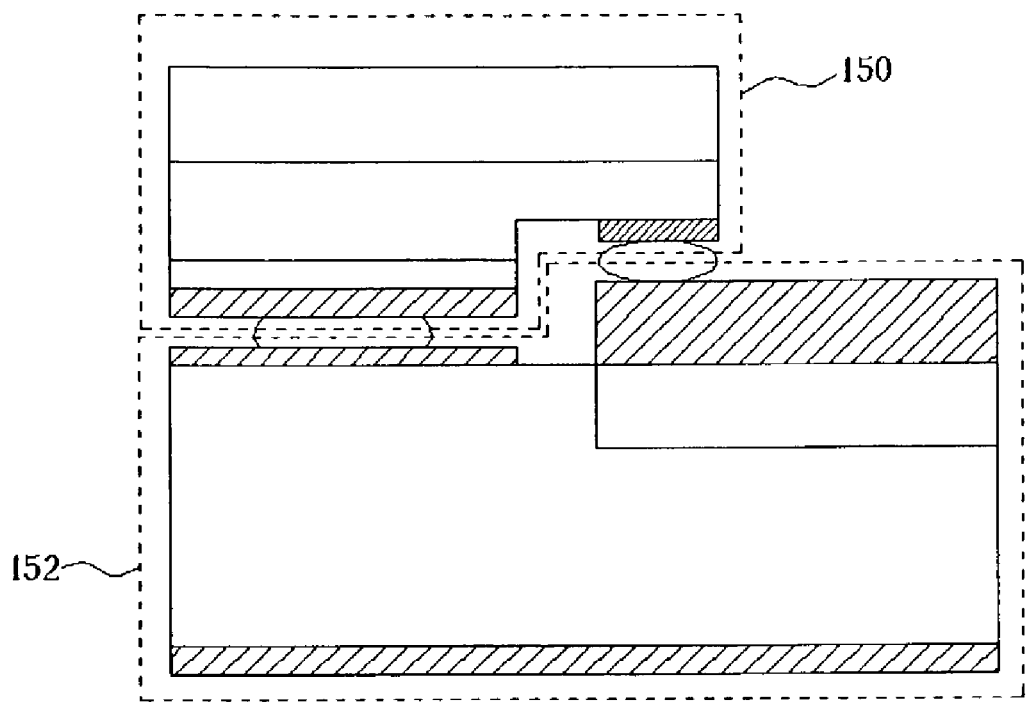
FIG. 2 shows a light emitting diode bonded with a silicon doped diode disclosed in a published U.S. patent application 2002/0179914.
Figure 3:
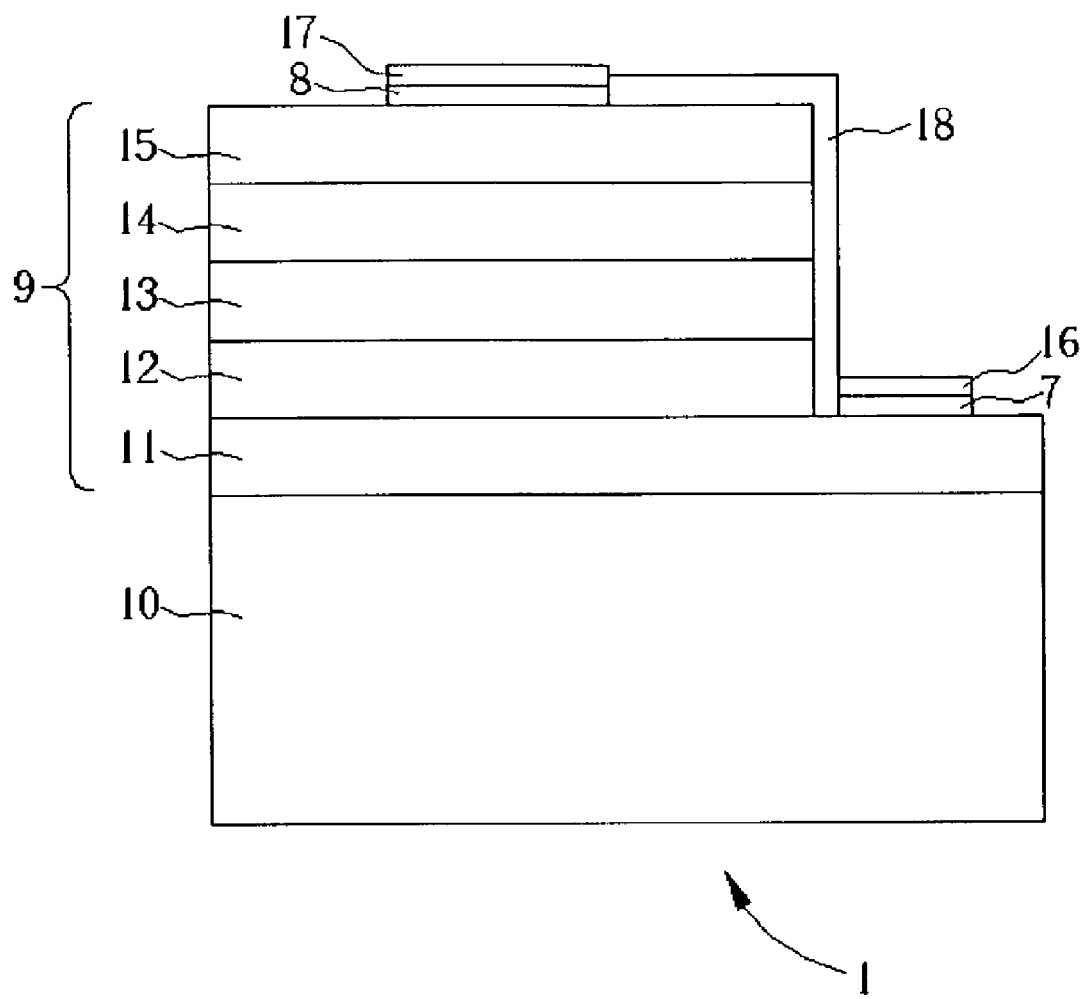
FIG. 3 shows a first light emitter according to the present invention.

Please refer to FIG. 3. FIG. 3 shows a first light emitter 1 according to the present invention. The light emitter 1 comprises a substrate 10, and an emitting stack 9 formed on the substrate 10. The emitting stack 9 comprises a first contact layer 11 having a first surface area and a second surface area, a first cladding layer 12 formed on the first surface area, an emitting layer 13 formed on the first cladding layer 12, a second cladding layer 14 formed on the emitting layer 13, and a second contact layer 15 formed on the second cladding layer 14. The light emitter 1 further comprises a first electrode 16 formed on the second surface area of the first contact layer 11, a second electrode 17 formed on the second contact layer 15, and a voltage dependent resistor layer 18 formed on the emitting stack 9 and connected to the first electrode 16 and the second electrode 17.

Figure 4:
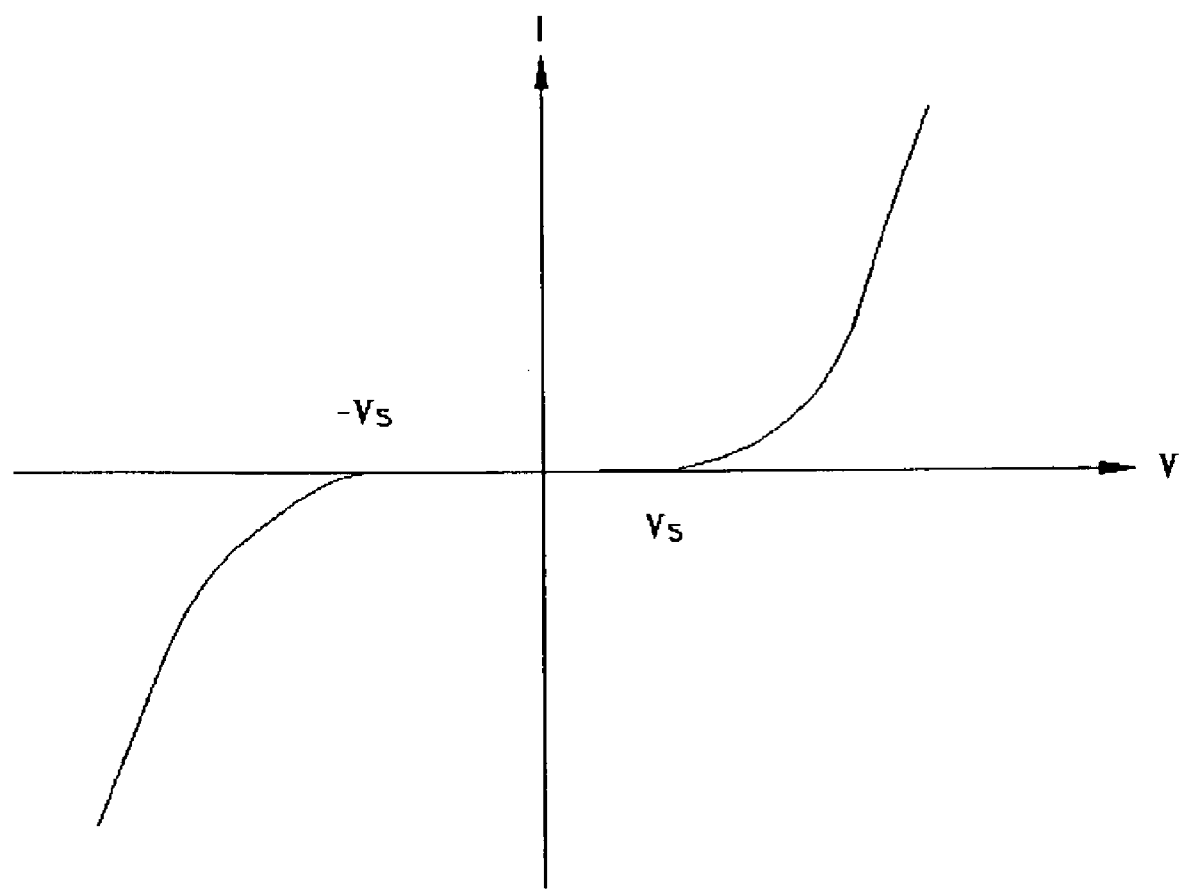
FIG. 4 shows a current vs. voltage relationship of the voltage dependent resistor layer in FIG. 3.

Please refer to FIG. 4. FIG. 4 shows a current vs. voltage relationship of the voltage dependent resistor layer 18. When voltage across the voltage dependent resistor layer 18 is between $V_S$ and $V_S$, the voltage dependent resistor layer 18 exhibits a very high resistance, and current is minimal. When voltage across the voltage dependent resistor layer 18 is not between $V_S$ and $V_S$, resistance of the voltage dependent resistor layer 18 decreases as the voltage increases. Therefore, when static electricity induced the voltage across the voltage dependent resistor layer 18 is higher than $V_S$ or lower than $V_S$, electric charges will be released through the voltage dependent resistor layer 18.

Figure 5:
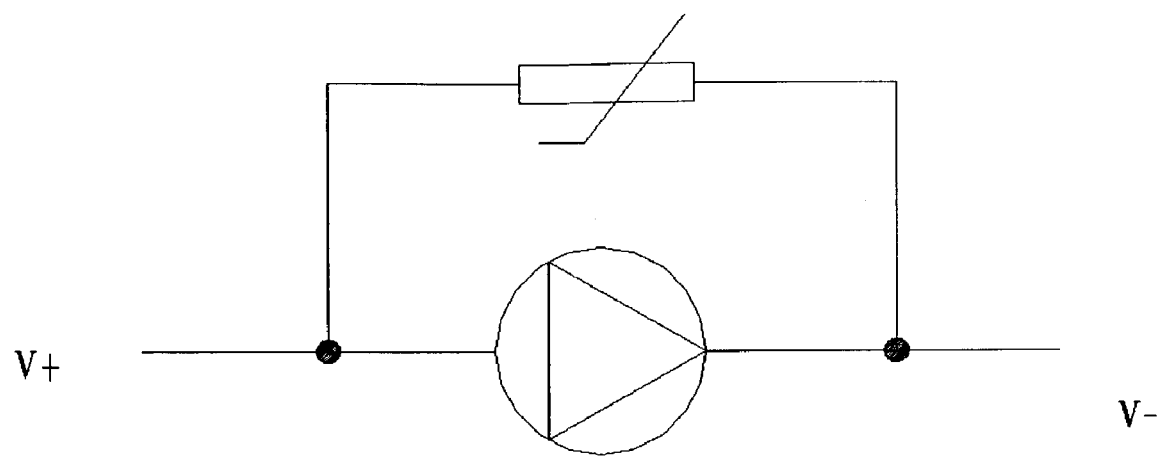
FIG. 5 is an equivalent circuit of the light emitter in FIG. 3.

Please refer to FIG. 5. FIG. 5 is an equivalent circuit of the light emitter 1. When static electricity induced voltage across the voltage dependent resistor layer 18 is higher than $V_S$ or lower than $V_S$, electric charges will be released through the voltage dependent resistor layer 18, rather than through the emitting stack 9, thus preventing the emitting stack 9 from being damaged by electric charges.

Figure 6:
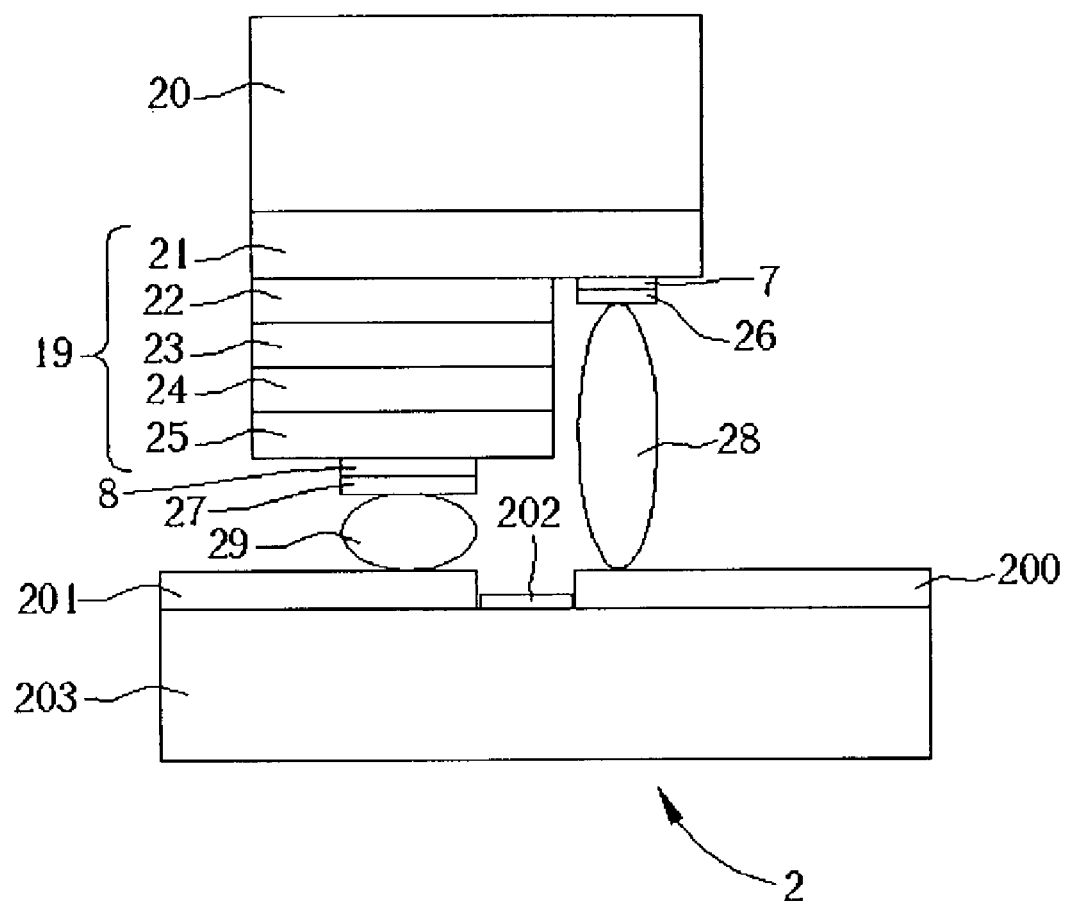
FIG. 6 shows a second light emitter according to the present invention.

Please refer to FIG. 6. FIG. 6 shows a second light emitter 2 according to the present invention. The light emitter 2 comprises a transparent substrate 20, and an emitting stack 19 formed on the transparent substrate 20. The emitting stack 19 comprises a first contact layer 21 having a first surface area and a second surface area, a first cladding layer 22 formed on the first surface area, an emitting layer 23 formed on the first cladding layer 22, a second cladding layer 24 formed on the emitting layer 23, and a second contact layer 25 formed on the second cladding layer 24. The light emitter 2 further comprises a first electrode 26 formed on the second surface area of the first contact layer 21, a second electrode 27 formed on the second contact layer 25, a first solder layer 28 formed on the first electrode 26, a second solder layer 29 formed on the second electrode 27, a first metal layer 200 formed on the first solder layer 28, a second metal layer 201 formed on the second solder layer 29, and a voltage dependent resistor layer 202 connected to the first metal layer 200 and the second metal layer 201, and a carrier 203 formed on the first metal layer 200, second metal layer 201 and voltage dependent resistor layer 202.

Figure 7:
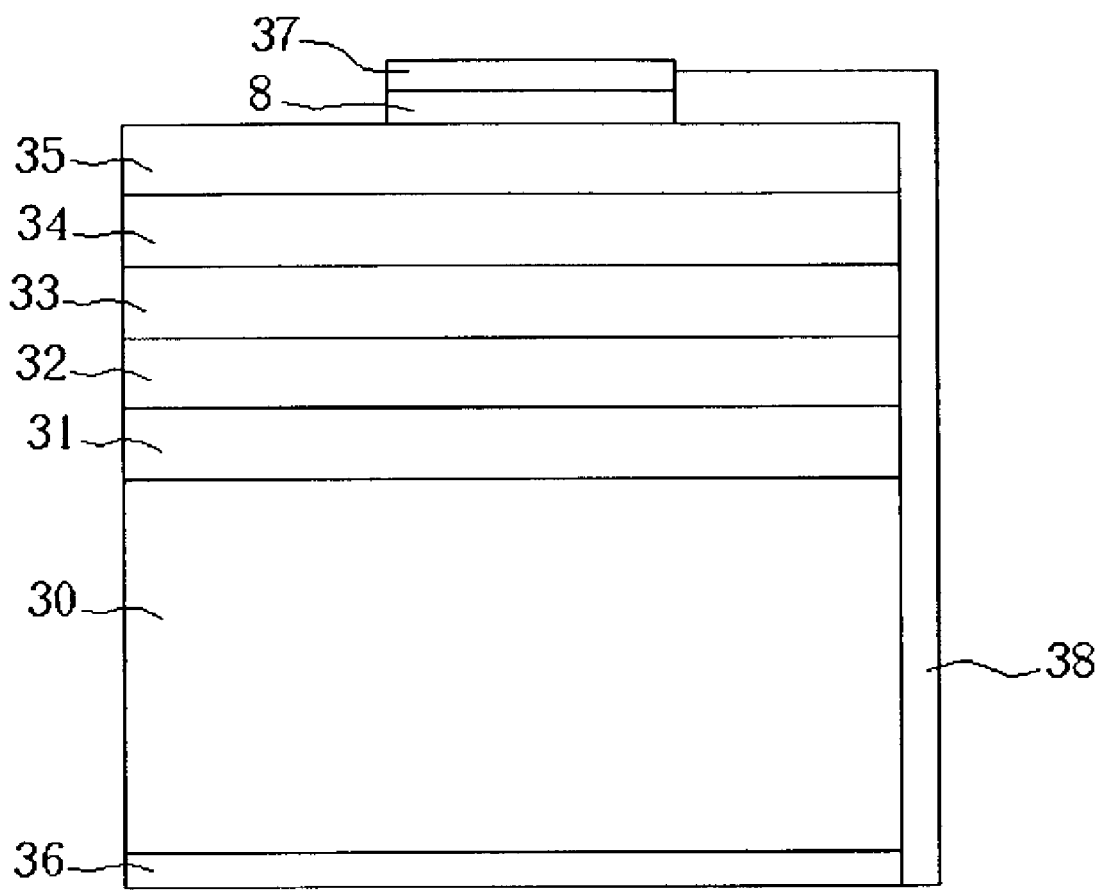
FIG. 7 shows a third light emitter according to the present invention.

Please refer to FIG. 7. FIG. 7 shows a third light emitter 3 according to the present invention. The light emitter 3 comprises a first electrode 36, a conductive substrate 30 formed on the first electrode 36, a Distributed Bragg reflector layer 31 formed on the conductive substrate 30, a first cladding layer 32 formed on the Distributed Bragg reflector layer 31, an emitting layer 33 formed on the first cladding layer 32, a second cladding layer 34 formed on the emitting layer 33, a second contact layer 35 formed on the second cladding layer 34, a second electrode 37 formed on the second contact layer 35, and a voltage dependent resistor layer 38 connected to the first electrode 36 and the second electrode 37.

A first transparent oxide conductive layer 7 can be formed between the first electrode 16, 26 and the second surface area of the first contact layer 11, 21 of the light emitter 1, 2. A second transparent oxide conductive layer 8 can be formed between the second electrode 17, 27, 37 and the second contact layer 15, 25, 35 of the light emitter 1, 2, 3. The substrate 10 comprises at least one material selected from a group consisting of Si, GaAs, SiC, GaP, AlGaAs, GaAsP, Al2O3, glass materials, and other replaceable materials. The transparent substrate 20 comprises at least one material selected from a group consisting of GaP, AlGaAs, GaAsP, Al2O3, glass materials, and other replaceable materials. The conductive substrate 30 comprises at least one material selected from a group consisting of GaP, AlGaAs, GaAsP, SiC, GaAs, Si, and other replaceable materials. Each of the transparent oxide conductive layers comprises at least one material selected from a group consisting of indium tin oxide, cadmium tin oxide, antimony tin oxide, zincoxide, zinc tin oxide, and other replaceable materials. The first cladding layer 12, 22, 32 comprises at least one material selected from a group consisting of AlGaInP, AlN, GaN, AlGaN, InGaN, AlGaInN, and other replaceable materials. The emitting layer 13, 23, 33 comprises at least one material selected from a group consisting of AlGaInP, GaN, InGaN, AlGaInN, and other replaceable materials. The second cladding layer 14, 24, 34 comprises at least one material selected from a group consisting of AlGaInP, AlN, GaN, AlGaN, InGaN, AlGaInN, and other replaceable materials. The first contact layer 11, 21 comprises at least one material selected from a group consisting of GaP, GaAs, GaAsP, InGaP, AlGaInP, AlGaAs, GaN, InGaN, AlGaN, AlGaInN, and other replaceable materials. The second contact layer 15, 25, 35 comprises at least one material selected from a group consisting of GaP, GaAs, GaAsP, InGaP, AlGaInP, AlGaAs, GaN, InGaN, AlGaN, AlGaInN, and other replaceable materials. The Distributed Bragg reflector layer 31 comprises at least one material selected from a group consisting of AlAs, GaAs, AlGaAs, and other replaceable materials. The voltage dependent resistor layer 18, 202, 38 comprises at least one material selected from a group consisting of ZnO, $CaF_2$, ZnS, $TiO_2$, Al—$Al_2O_3$—Au, Co—NiO, polymethyl-methylacrylate, $SrTiO_3$, and other replaceable materials.

Compared to the related art, the voltage dependent resistor layer 18, 202, 38 used to release electric charges is formed during the formation of the light emitter 1, 2, 3, thus greatly enhancing the yield of the light emitter 1, 2, 3. Further, after the light emitter 1, 2, 3 is formed, no subsequent process is needed to prevent static electricity discharge damage.

Those skilled in the art will readily observe that numerous modifications and alterations of the light emitter may be made while retaining the teachings of the invention. Accordingly, the above disclosure should be construed as limited only by the metes and bounds of the appended claims.

What is claimed is:

1. A light emitter comprising:
    an emitting stack having a first surface area and a second surface area;
    a first electrode formed on the first surface area of the emitting stack;
    a second electrode formed on the second surface area of the emitting stack; and
    a voltage dependent resistor layer formed on the emitting stack and connected to the first and second electrodes.

2. The light emitter of claim 1 wherein the first and second surface areas are on the same side of the emitting stack.

3. The light emitter of claim 1 wherein the first and second surface areas are on different sides of the emitting stack.

4. The light emitter of claim 1 further comprising a substrate,
    wherein the emitting stack comprises: a first contad layer formed on the substrate; a first cladding layer formed on a first surface area of the first contact layer; an emitting layer formed on the first cladding layer; a second cladding layer formed on the emitting layer; and a second contact layer formed on the second cladding layer;
    wherein the first electrode is formed on a second surface area of the first contact layer, and the second electrode is formed on the second contact layer.

5. The light emitter of claim 4 wherein the substrate comprises at least one material selected from a group consisting of Si, GaAs, SiC, GaP, AlGaAs, GaAsP, Al2O3, and glass materials.

6. The light emitter of claim 4 wherein each of the contact layers comprises at least one material selected from a group consisting of GaP, GaAs, GaAsP, InGaP, AlGaInP, AlGaAs, GaN, InGaN, AlGaN, and AlGaInN.

7. The light emitter of claim 4 wherein each of the cladding layers comprises at least one material selected from a group consisting of AlGaInP, AlN, GaN, AlGaN, InGaN, and AlGaInN.

8. The light emitter of claim 4 wherein the emitting layer comprises at least one material selected from a group consisting of AlGaInP, GaN, InGaN, and AlGaInN.

9. The light emitter of claim 4 further comprising a first transparent oxide conductive layer formed between the first electrode and the second surface area of the first contact layer, and a second transparent oxide conductive layer formed between the second electrode and the second contact layer, each of the transparent oxide conductive layers comprising at least one material selected from a group consisting of indium tin oxide, cadmium tin oxide, antimony tin oxide, zincoxide, and zinc tin oxide.

10. The light emitter of claim 1 wherein the voltage dependent resistor layer comprises at least one material selected from a group consisting of ZnO, $CaF_2$, ZnS, $TiO_2$, Al—$Al_2O_3$—Au, Co—NiO, polymethyl-methylacrylate, and $SrTiO_3$.

11. The light emitter of claim 4 wherein the voltage dependent resistor layer is formed on the second contact layer and on a side of the emitting stack for respectively connecting to the second electrode and the first electrode.

12. The light emitter of claim 11 wherein the voltage dependent resistor layer is formed on the second contact layer beside the second electrode for connecting to the second electrode.

13. The light emitter of claim 1 wherein the voltage dependent resistor layer is formed directly on the emitting stack.

* * * * *